United States Patent
Fujimoto

(10) Patent No.: US 7,534,727 B2
(45) Date of Patent: *May 19, 2009

(54) METHOD FOR MANUFACTURING SEMICONDUCTOR DEVICE

(75) Inventor: Masashi Fujimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 266 days.

This patent is subject to a terminal disclaimer.

(21) Appl. No.: 11/600,057

(22) Filed: Nov. 16, 2006

(65) Prior Publication Data

US 2008/0085592 A1    Apr. 10, 2008

(30) Foreign Application Priority Data

Oct. 5, 2006    (JP) ............................. 2006-273867

(51) Int. Cl.
H01L 21/302    (2006.01)

(52) U.S. Cl. ............... 438/736; 438/706; 257/E21.232; 257/E21.222

(58) Field of Classification Search ........................ None
See application file for complete search history.

(56) References Cited

U.S. PATENT DOCUMENTS

2008/0085608 A1* 4/2008 Fujita et al. ................. 438/758

FOREIGN PATENT DOCUMENTS

| JP | 2005-86119 | 3/2005 |
| JP | 2005-201967 | 7/2005 |

* cited by examiner

Primary Examiner—N Drew Richards
Assistant Examiner—Pamela E Perkins
(74) Attorney, Agent, or Firm—Young & Thompson

(57) ABSTRACT

A predetermined pattern containing a plurality of gate patterns, in the process of formation thereof, is classified into fine gate patterns and the other patterns (S102), and a hard mask film is formed on a process target film (S106). Next, a first resist film having a fine first pattern is formed on the hard mask film, and the hard mask film is then patterned (S108). Thereafter, a resist film having a separate pattern is formed on the hard mask film, and a process target film is selectively dry-etched through the hard mask film and the resist film used as masks (S110 and S112).

7 Claims, 11 Drawing Sheets

METHOD FOR MANUFACTURING SEMICONDUCTOR DEVICE

This application is based on Japanese patent application No. 2006-273,867, the content of which is incorporated hereinto by reference.

BACKGROUND

1. Technical Field

The present invention relates to a method of manufacturing a semiconductor device.

2. Related Art

With further advancement in integration level and higher operation speed of devices, a demand has arisen in the lithographic process, in particular in a step of forming the gate pattern, with respect to formation of fine gate patterns far shorter than the wavelength of exposure light. It is very difficult to form fine patterns equal to or smaller than half of the wavelength of exposure light, so that various resolution enhancement techniques are under discussion.

Patent Document 1 (Japanese Laid-Open Patent Publication No. 2005-201967) describes a technique using the Levenson-type phase shift mask (PSM). The Levenson-type PSM is particularly excellent in effects of improving optical contrast and resolution performance, and is supposed to be an expectant technique of forming fine patterns equal to or smaller than half of the wavelength of exposure light. Phase shifters so as to change phase of transmitted light (through the phase shifters) by $\pi$ are disposed on the Levenson-type PSM. The light intensity becomes zero at the bounadry between phase-shifter area and non-shifter area by complete canceling of positive-negative (0-$\pi$) photo-electric fields based on optical interference.

Patent Document 1 describes a configuration having gate electrodes of transistors agreed with respect to the longitudinal direction thereof. The document also describes procedures by which the gate electrode pattern is formed so as to extend to the end of the block in the longitudinal direction, and an unnecessary portion of the extended pattern is then removed. The procedures can realize a 0-$\pi$ alternative arrangement of the shifters of the Levenson-type PSM, and can thereby suppress influences of setback of the line end and corner rounding of the gate patterns.

The Levenson-type PSM is, however, based on an image-forming method making an intentional use of interference of light wave using a small σillumination, so that influences of proximity effects (dense-scarce dependence of dimension, constriction, corner rounding, etc.) ascribable to interference of light become large by principle. A distinct dimensional variation occurs particularly in the gates adjacent to contact pads and so forth. There has conventionally been a well-known technique, OPC (optical proximity correction), modifying a mask pattern in order to obtain the designed pattern shape on a wafer, by taking the proximity effect into consideration. Increased complexity in the circuit pattern has, however, raised a problem of complicating the OPC, and of consequently increasing the operation load. Complicated circuit pattern has degraded the accuracy of correction, and resulting in the electrical characteristics of fabricated devices.

Patent Document 2 (Japanese Laid-Open Patent Publication No. 2005-86119) describes a method of forming a fine pattern, aimed at fabricating a photomask having a transmission portion and intercepting portion for light exposure onto a photo resist film, the method including a step of extracting regions where line portions and contact portions of a pattern of a photomask are adjacent to each other, and fabricating a first mask composed of the line portions and a second mask composed of the contact portions; a step of illuminating the resist through a first mask under a first illumination condition; and a step of illuminating the resist through a second mask under a second illumination condition. According to the description, dimensional errors of the final resist pattern ascribable to the optical proximity effect can be reduced.

[Patent Document 1] Japanese Laid-Open Patent Publication No. 2005-201967

[Patent Document 2] Japanese Laid-Open Patent Publication No. 2005-86119

SUMMARY OF THE INVENTION

The technique described in Patent Document 2, however, still remains a room of improvement, due to poor accuracy of formation of fine patterns. Use of different masks for the line portions and the contact portions has certainly been successful in reducing the dimensional errors in the resist mask, as compared with the case where both portions are formed using a single mask. However, even in this case, it is difficult to completely eliminate the dimensional errors. For this reason, the resist causes the dimensional errors such as corner rounding when illuminated through the first mask. If the resist in this state is illuminated through the second mask, a dimensional error relative to the second mask can occur, showing a larger tendency of occurrence of error at locations having the corner rounding and so forth previously occurred therein by the first exposure of light. In particular, regions where a plurality of patterns overlap and cross with each other are more likely to cause the dimensional errors. It has, therefore, been difficult to form the fine patterns in a precise manner. It has, therefore, been difficult to form the fine patterns in a precise manner.

According to the present invention, there is provided a method of manufacturing a semiconductor device including a step of forming a predetermined pattern containing a plurality of gate patterns, in a process target film formed on or over a semiconductor substrate, the method has:

a step of forming the predetermined pattern;

a step of classifying the predetermined pattern into fine gate patterns and the other patterns;

a step of forming a first resist film having a first pattern, by forming a hard mask film and a resist film in this order on the process target film, and by subjecting the resist film to light exposure through a first photomask having the first pattern for forming the fine gate patterns, followed by development;

a step of forming the first pattern into the hard mask film, by selectively dry-etching the hard mask film through the first resist film used as a mask;

a step of forming a second resist film having a second pattern, by forming a resist film on the process target film and the hard mask film, and by subjecting the resist film to light exposure through a second photomask having the second pattern for forming the other patterns, followed by development; and a step of selectively dry-etching the process target film through the second resist film and the hard mask film used as masks.

As described in the above, precise patterning is now realized by transferring the fine gate patterns to the hard mask film using the resist film having the fine gate patterns, after classifying the fine gate patterns and the other pattern, and thereafter by forming the other patterns in another resist film.

In the step of classifying the predetermined pattern into the fine gate patterns and the other patterns, gate patterns having width smaller than a predetermined width can be classified into the fine gate patterns, and gate patterns having width not narrower than the predetermined width can be classified into the other patterns.

The fine gate pattern can typically be formed by patterning the resist film with the aid of light exposure using a small-σ illumination through the Levenson-type PSM. On the other hand, the wide gate patterns cannot make use of the phase shift effect by principle even if the Levenson-type PSM is used, because 0 and π are largely brought apart from each other by Cr light intercepting portion. For a layout having fine gates and wide gates mixed therein, it is therefore preferable to illuminate the wide gates using a simple large-σ illumination through a conventional mask. By patterning the wide gate patterns and the fine gate patterns in separate process steps, accuracy of the patterning can further be improved.

The present invention can improve dimensional accuracy of gate patterns of semiconductor devices.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
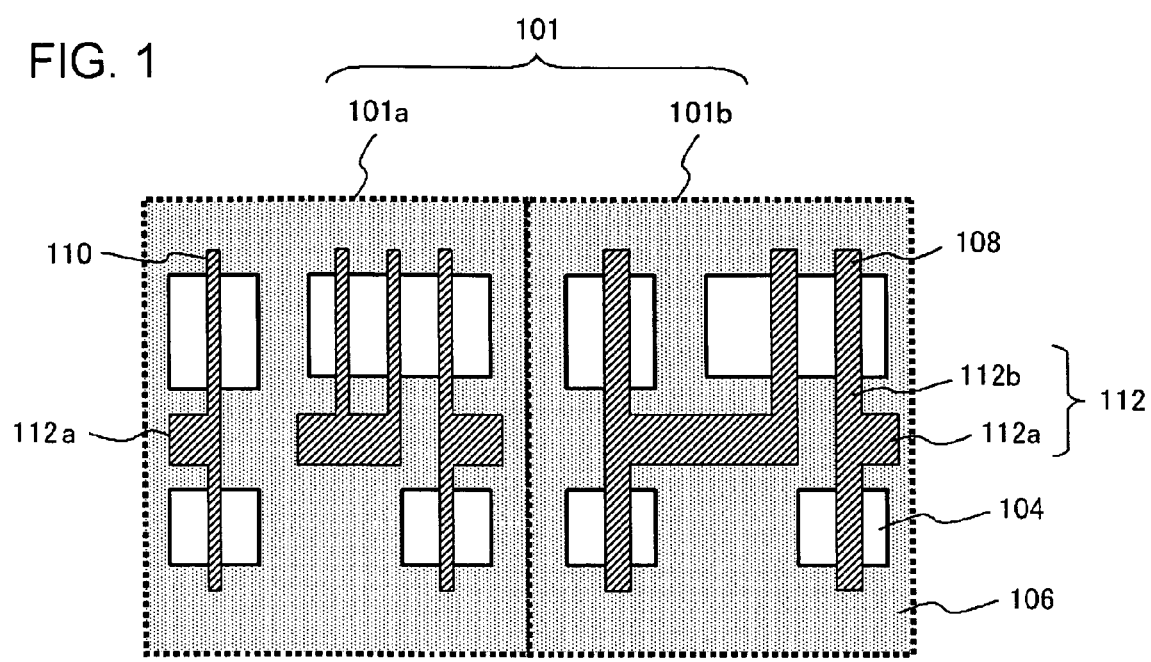
FIG. 1 is a top view of a semiconductor device manufactured by the method of manufacturing a semiconductor device in an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be explained below, referring to the attached drawings. It is to be noted that any similar constituents will be given with similar reference numerals in all drawings, so as to properly avoid repetitive explanations.

FIG. 1 is a top view showing a configuration of a semiconductor device 100 manufactured by the method of manufacturing a semiconductor device in an embodiment of the present invention.

The drawing herein shows a layout of an upper block 101 containing a first basic block 101a and a second basic block 101b formed on the semiconductor device 100. The first basic block 101a and the second basic block 101b are minimum units of basic blocks in which a logic circuit such as a NOT element or a NAND element, or a memory circuit is formed. The upper block 101 is a block composed of a plurality of basic blocks combined therein.

The semiconductor device 100 includes an element isolation insulating film 106 and impurity diffused regions 104 formed in the surficial portion of a semiconductor substrate (not shown), and a pattern 108 formed on these components. The pattern 108 includes fine gate patterns 110 and the other wide patterns 112. The wide patterns 112 includes contact pads 112a and wide gate patterns 112b. The fine gate patterns 110 and the wide gate patterns 112b are gate patterns of transistors.

Figure 2:
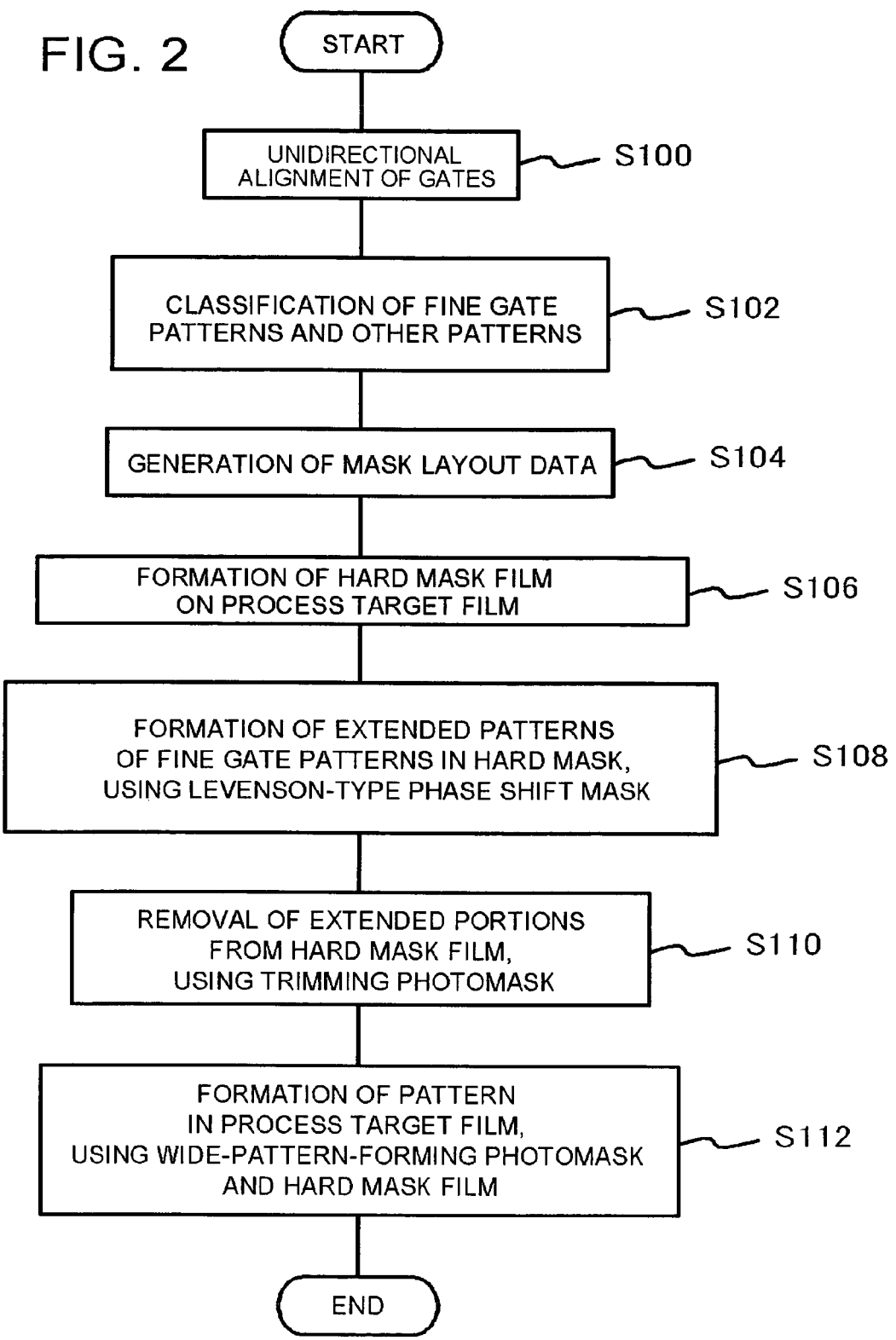
FIG. 2 is a flow chart showing procedures of forming the pattern as shown in FIG. 1, in the embodiment of the present invention.

FIG. 2 is a flow chart showing procedures for forming the pattern as shown in FIG. 1 in this embodiment.

In this embodiment, the gate patterns such as the fine gate patterns 110 and the wide gate pattern 112b are laid out as being extended in a single specific direction within each of the basic blocks (S100). More specifically, the gates of the transistors are laid out as being extended in a single specific direction within the upper block having the individual basic blocks combined therein. More preferably, the gates of the transistors are laid out as being extended in a single specific direction over the entire portion of a chip.

Under these conditions, the pattern 108 is classified into the fine gate patterns 110 and the other patterns (S102). In this embodiment, the fine gate patterns 110 can be formed by patterning a resist film by light exposure based on a small-σ illumination through a Levenson-type PSM. On the other hand, the other patterns can be formed by patterning a resist film by light exposure based on a large-σ illumination through a general mask. The small-σ illumination may be illumination characterized by approximately σ≦0.5, more preferably σ<0.4, and the large-σ illumination may be illumination characterized by approximately σ≧0.5, more preferably σ>0.7.

The gate patterns herein having width smaller than a predetermined width can be classified into the fine gate patterns, and the gate patterns having width not narrower than the predetermined width can be classified into the other patterns. The predetermined width can be set based on the minimum resolution attainable when the general mask for forming the other patterns is used. The minimum resolution $R_{es}$ is given by the equation below:

$R_{es}=k_1 \times \lambda/NA$ (λ is wavelength of exposure light, NA is the number of aperture, and $k_1$ is a process constant determined typically by types of the mask to be adopted).

For example, a general mask used for the other patterns can be given as a binary mask (chromium mask) with a process constant of $k_1$=0.5. Assuming that the exposure wavelength λ is 193 nm and the number of aperture NA is 0.8, the minimum resolution $R_{es}$ is given as 120.625 nm. Accordingly, the gate patterns having width of narrower than 120.625 nm can be classified into the fine gate patterns, and the wide gate patterns having width of 120.625 nm or larger can be classified into the other patterns.

Next, mask layout data is generated (S104). The processing can be executed automatically on the software basis. In this embodiment, the mask layout data is generated according to the procedures described below.

(1) The fine gate patterns are extracted from the layout data of the pattern 108, and named as mask layout data $A_0$. The other patterns are named as mask layout data B. Any overlapped portions of the fine gate patterns 110 and the contact pads 112a can be included into the individual patterns.

(2) The mask layout data $A_0$ is added with extended patterns 114 obtained by extending the fine gate pattern 110 in the longitudinal direction thereof up to the end (boundary) of the first basic block 101a, so as to obtain mask layout data $A_1$.

(3) Mask data pattern (trimming mask data) C, used for removing the extended pattern 114 from the mask layout data $A_1$, is prepared.

Figure 3:
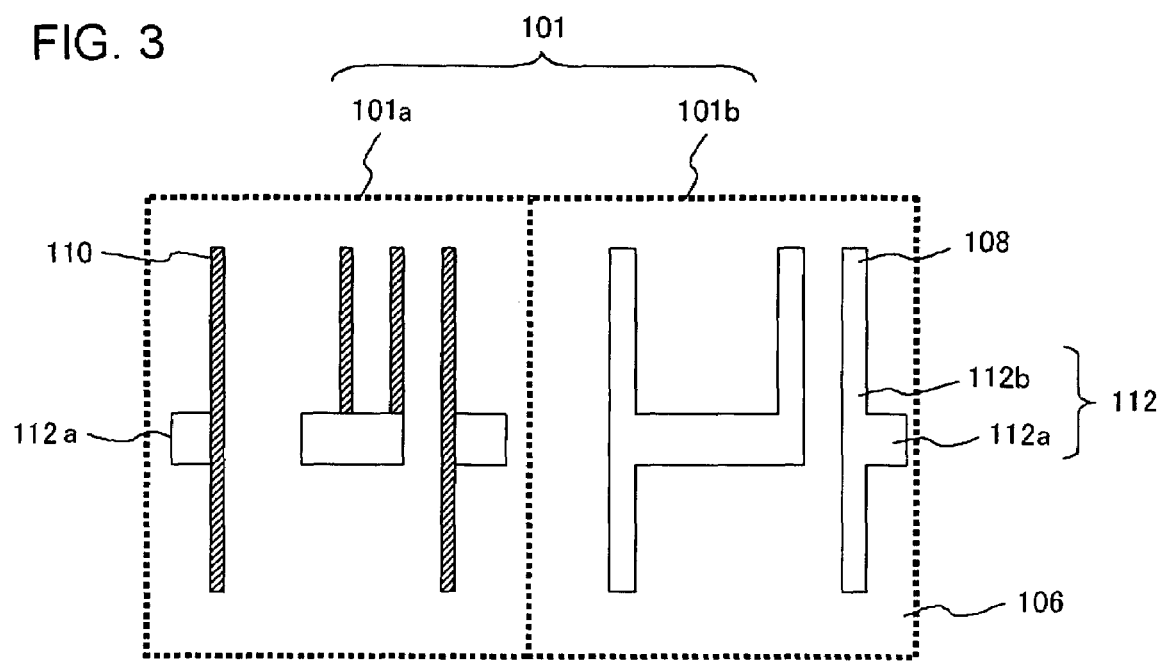
FIG. 3 is a drawing showing a mask layout data $A_0$ for forming the fine gate patterns out of patterns shown in FIG. 1.
Figure 4:
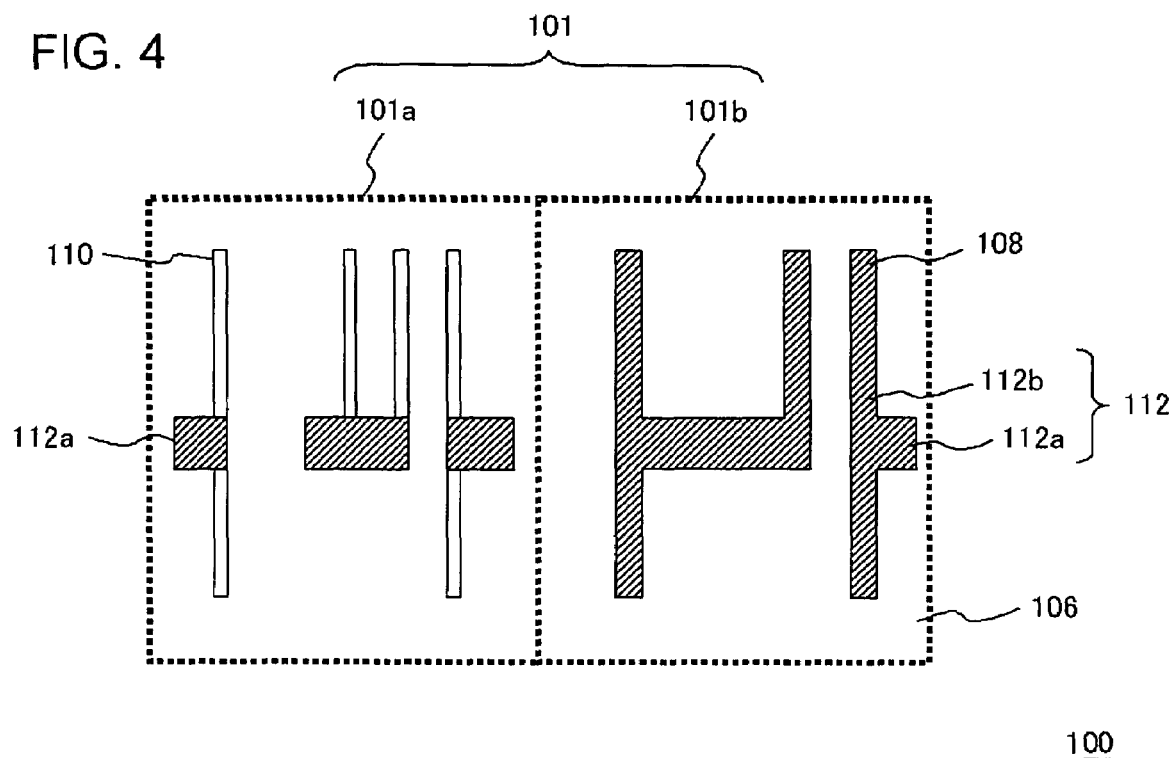
FIG. 4 is a drawing showing a mask layout data B for forming the wide gate patterns out of patterns shown in FIG. 1.

FIG. 3 is a drawing showing the mask layout data $A_0$ used for forming the fine gate pattern 110 out of the pattern 108. FIG. 4 is a drawing showing the mask layout data B used for forming the wide pattern 112 other than the fine gate pattern 110.

Figure 5:
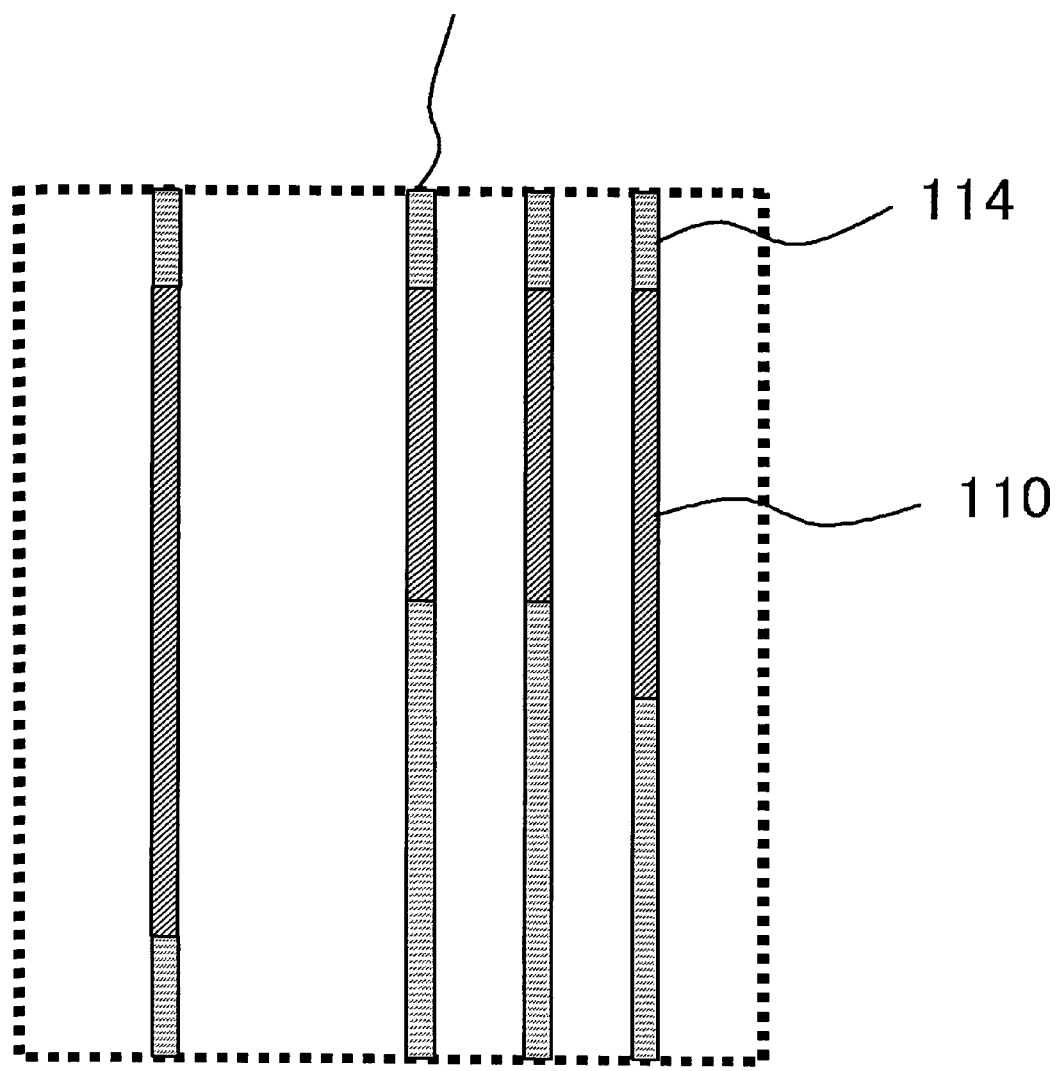
FIG. 5 is a drawing showing a mask layout data $A_1$ for forming the fine gate pattern and extended patterns.

FIG. 5 is a drawing showing the mask layout data $A_1$ used for forming the fine gate patterns 110 and the extended patterns 114. By the processing, the pattern in the mask layout data $A_1$ can be given as a simple linear line and space (L&S). This is successful in excluding the inner corner except for the block end. It is therefore made possible to avoid any influences of constriction or corner rounding, otherwise anticipated when the Levenson-type PSM is used. Also any phenomena such that the distance to the adjacent pattern or width of the shifters could vary in midway of the line are avoidable, so that the OPC accuracy can distinctively be improved while suppressing influences of the optical proximity effect. Also this process can automatically be processed on the software basis.

Referring now back to FIG. 2, a hard mask film is formed on the process target film (S106). Next, an extended pattern of the fine gate patterns 110 are formed in the hard mask film using the Levenson-type PSM (S108).

As shown in FIG. 5, the mask layout data $A_1$ is given as a simple linear L&S pattern. Accordingly, phase shifters of 0 and π may alternatively be disposed, so as to start from one end. This is successful in completely avoiding occurrence of phase contradiction. Also this process can automatically be processed on the software basis.

Figure 6:
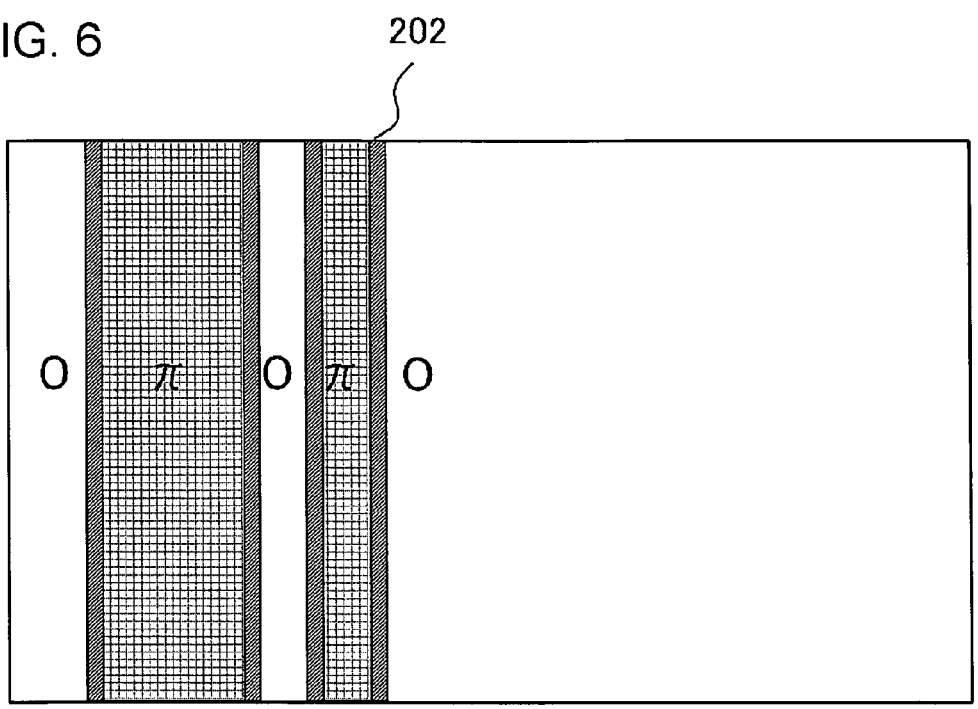
FIG. 6 is a drawing showing a configuration of a Levenson-type PSM in the embodiment of the present invention.

FIG. 6 is a drawing showing a configuration of thus formed Levenson-type phase shift mask 200. The Levenson-type PSM 200 has light intercepting portions 202 at the locations corresponded to the fine gate patterns 110 and the extended patterns 114. In step S106, first, a resist film is formed on the hard mask film. Next, the first pattern is transferred to the resist film using the Levenson-type PSM 200. Thereafter, the hard mask film is selectively dry-etched through the resist film used as a mask, to thereby form the first pattern in the hard mask film.

Figure 7:
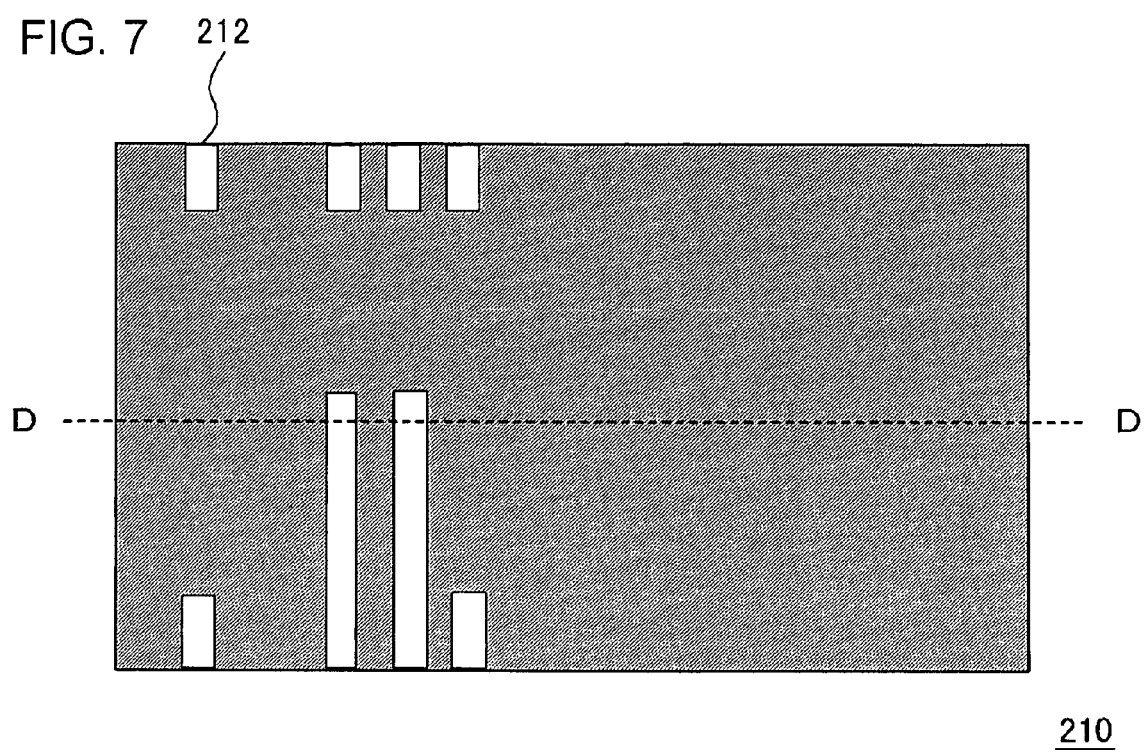
FIG. 7 is a drawing showing a configuration of a trimming photomask in the embodiment of the present invention.

Succeedingly, the extended portions are removed from the hard mask film, using the trimming photomask (S110). FIG. 7 is a drawing showing a configuration of the trimming photomask 210. The trimming photomask 210 has openings 212 at the locations corresponded to the extended patterns 114 shown in FIG. 5.

Figure 8:
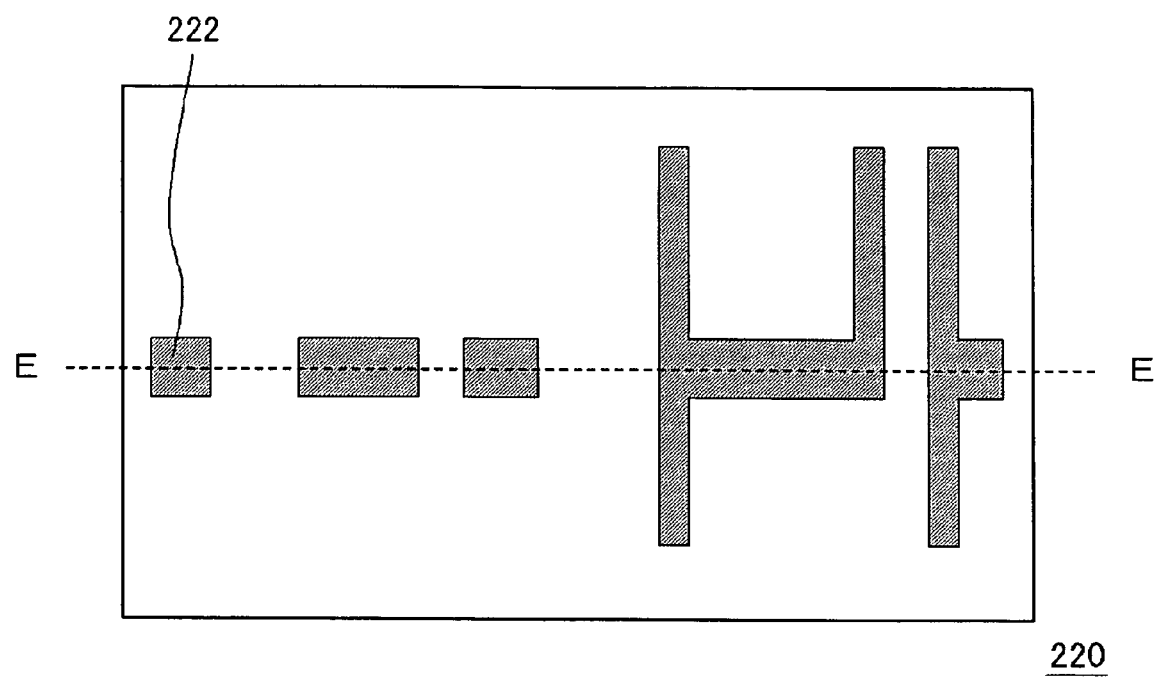
FIG. 8 is a drawing showing a configuration of a photomask for forming wide patterns in the embodiment of the present invention.

Thereafter, the pattern is formed in the process target film using the wide-pattern-making photomask and the hard mask film (S112). FIG. 8 is a drawing showing a configuration of a wide-pattern-making photomask 220. The wide-pattern-making photomask 220 has light intercepting portions 222 at the locations corresponded to the wide patterns 112.

Next, procedures of manufacturing the semiconductor device 100 in this embodiment will specifically be described, referring to FIG. 9A to FIG. 11C.

Figure 9A:
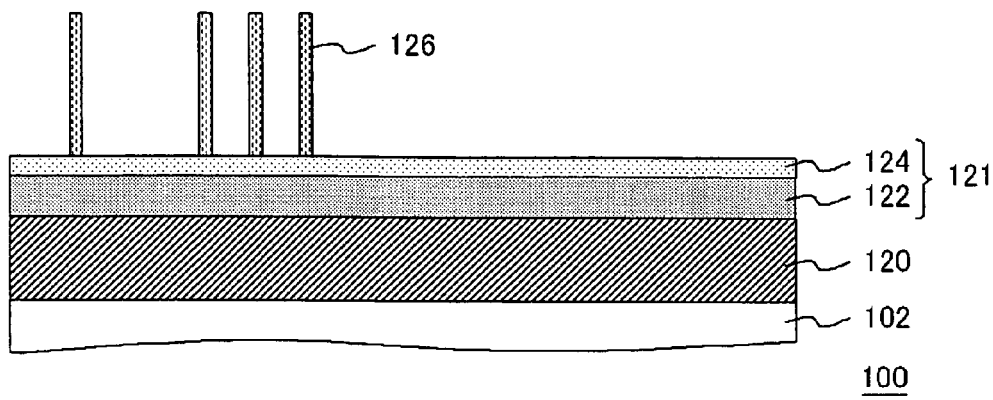
FIGS. 9A, 9B and 9C are drawings showing procedures of manufacturing the semiconductor device in an embodiment of the present invention.

As shown in FIG. 9A, the semiconductor device 100 includes a semiconductor substrate 102, a polysilicon film 120 formed thereon, and a hard mask film 121 formed over the semiconductor substrate 102. In this embodiment, the hard mask film 121 is composed of a stacked film having an amorphous carbon film 122 (first hard mask film) and a SiOC film 124 (second hard mask film) stacked in this order. Although not shown, there is a gate insulating film formed between the semiconductor substrate 102 and the polysilicon film 120.

On thus-configured hard mask film 121, a fine-gate-making resist film 126 (first resist film) is formed. Next, the fine-gate-making resist film 126 is illuminated through the Levenson-type PSM 200 shown in FIG. 6, to thereby transfer the pattern (first pattern) of the Levenson-type PSM 200 to the fine-gate-making resist film 126 (FIG. 9A). The light exposure of the fine-gate-making resist film 126 herein can be carried out using a small-σ illumination (σ=0.3, for example).

In this embodiment, the pattern of the Levenson-type PSM 200 is given as a simple linear line and space (L&S), so that the light exposure can be carried out with an excellent accuracy.

Figure 9B:
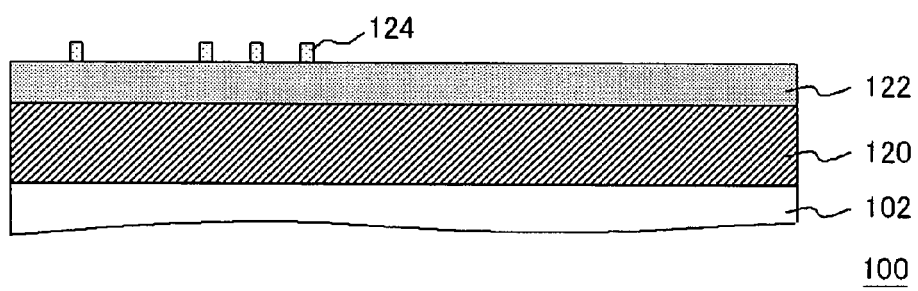
Figure 9C:
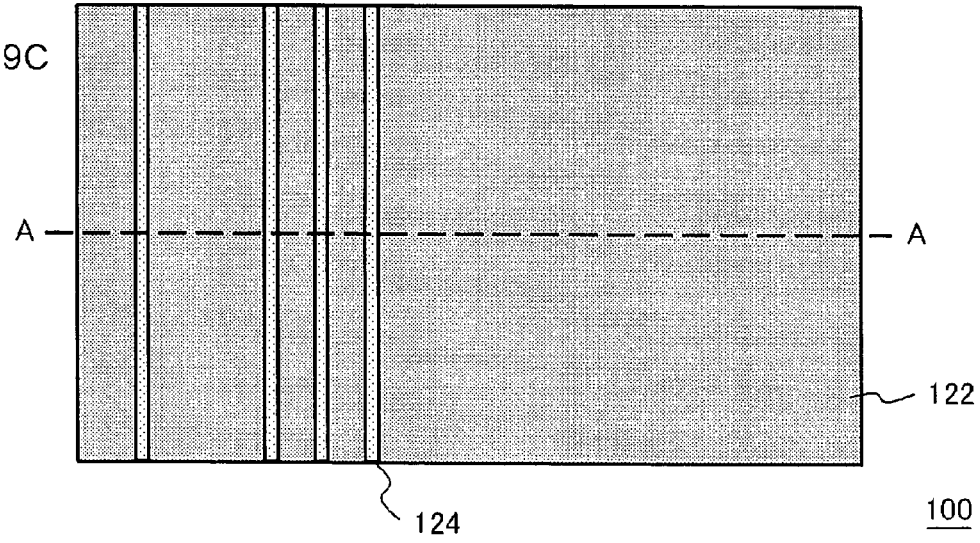

Next, the SiOC film 124 is selectively dry-etched through the fine-gate-making resist film 126 used as a mask, to thereby form the first pattern in the SiOC film 124 (FIG. 9B, FIG. 9C). FIG. 9B is a sectional view taken along line A-A in FIG. 9C.

Figure 10A:
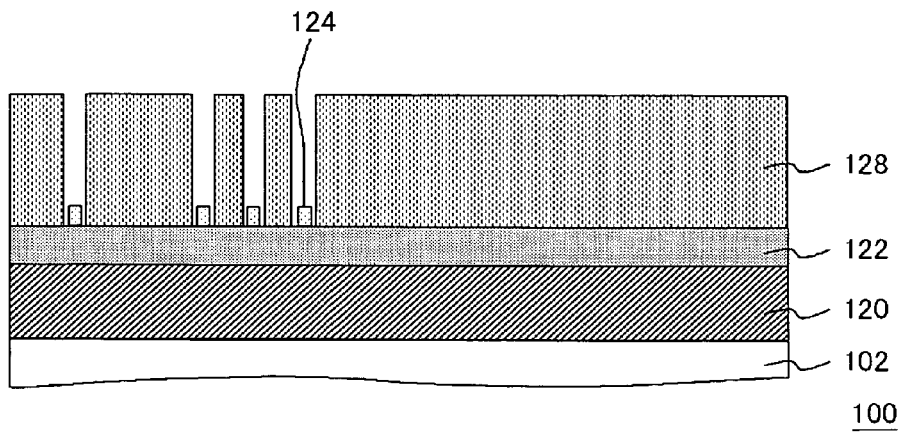
FIGS. 10A, 10B and 10C are drawings showing procedures of manufacturing the semiconductor device in an embodiment of the present invention.

Thereafter, the fine-gate-making resist film 126 is removed typically by ashing, and thereby a trimming resist film 128 is formed on the amorphous carbon film 122 and the SiOC film 124. Next, the trimming resist film 128 is illuminated through the trimming photomask 210 shown in FIG. 7, to thereby transfer the pattern (third pattern) of the trimming photomask 210 to the trimming resist film 128 (FIG. 10A). FIG. 10A is a sectional view of a portion corresponded to the D-D section of the trimming photomask 210 shown in FIG. 7. The light exposure through the trimming photomask 210 can be carried out using a large-σ illumination (σ=0.8, for example).

Next, the SiOC film 124 is selectively dry-etched through the trimming resist film 128 used as a mask, to thereby remove the portion corresponded to the extended patterns 114. By this process, a pattern (fourth pattern) corresponded to the fine gate patterns 110 is formed in the SiOC film 124.

Figure 10B:
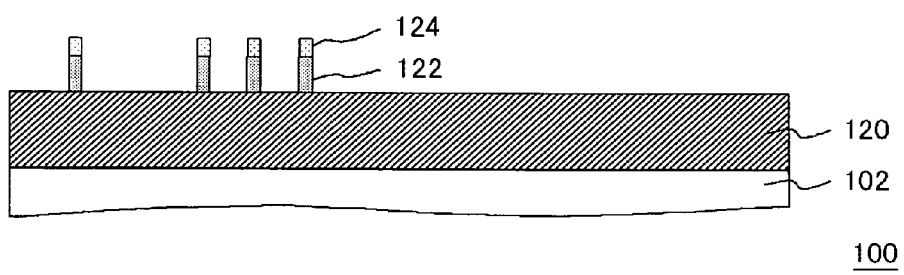
Figure 10C:
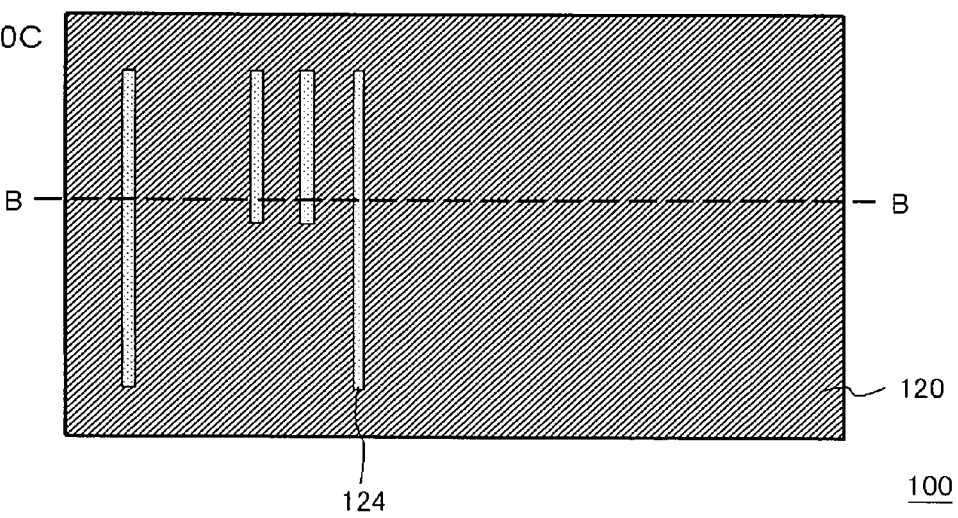

Thereafter, the trimming resist film 128 is removed typically by ashing. Next, the amorphous carbon film 122 is selectively dry-etched through the SiOC film 124 used as a mask (FIG. 10B, FIG. 10C). FIG. 10B is a sectional view taken along line B-B in FIG. 10C.

Figure 11A:
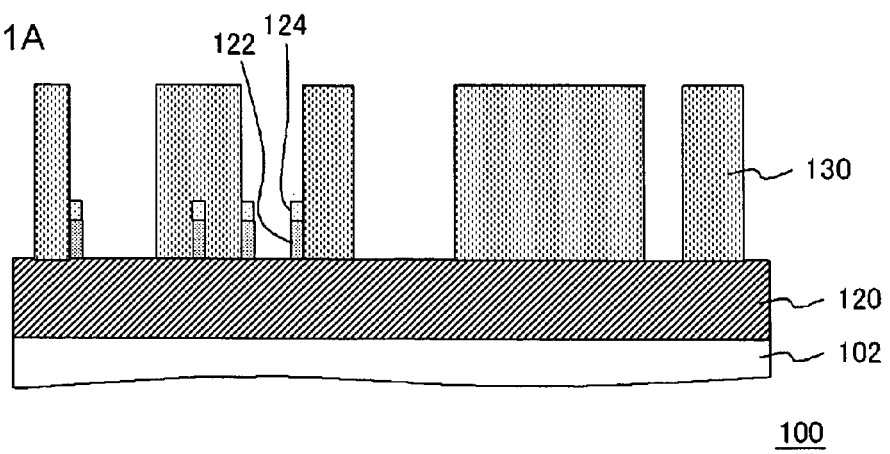
FIGS. 11A, 11B and 11C are drawings showing procedures of manufacturing the semiconductor device in an embodiment of the present invention.

Next, a wide-pattern-making resist film 130 is formed on the polysilicon film 120, the amorphous carbon film 122 and the SiOC film 124. Next, using the wide-pattern-making photomask 220 shown in FIG. 8, wide-pattern-making resist film 130 is illuminated so as to transfer the pattern (second pattern) of the wide-pattern-making resist film 130 (FIG. 11A). FIG. 11A is a sectional view of a portion corresponded to the E-E section of the wide-pattern-making photomask 220 shown in FIG. 8. The light exposure herein through the wide-pattern-making photomask 220 can be carried out using a large-σ illumination (σ=0.8, for example). The large-σ illumination can suppress influences of distortion and proximity effects, and also can suppress the constriction, by virtue of a large depth of focus for dense patterns and an averaging effect by virtue of a large area of light source. As a consequence, degradation in dimensional accuracy of gate pattern can be reduced even under the presence of wide interconnects cross normal to the contact pads and the wide gates patterns. An efficient and accurate patterning can therefore be realized.

Figure 11B:
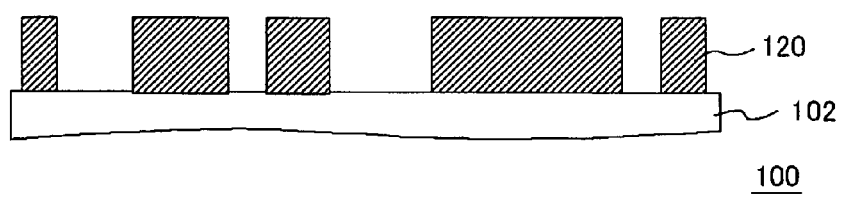
Figure 11C:
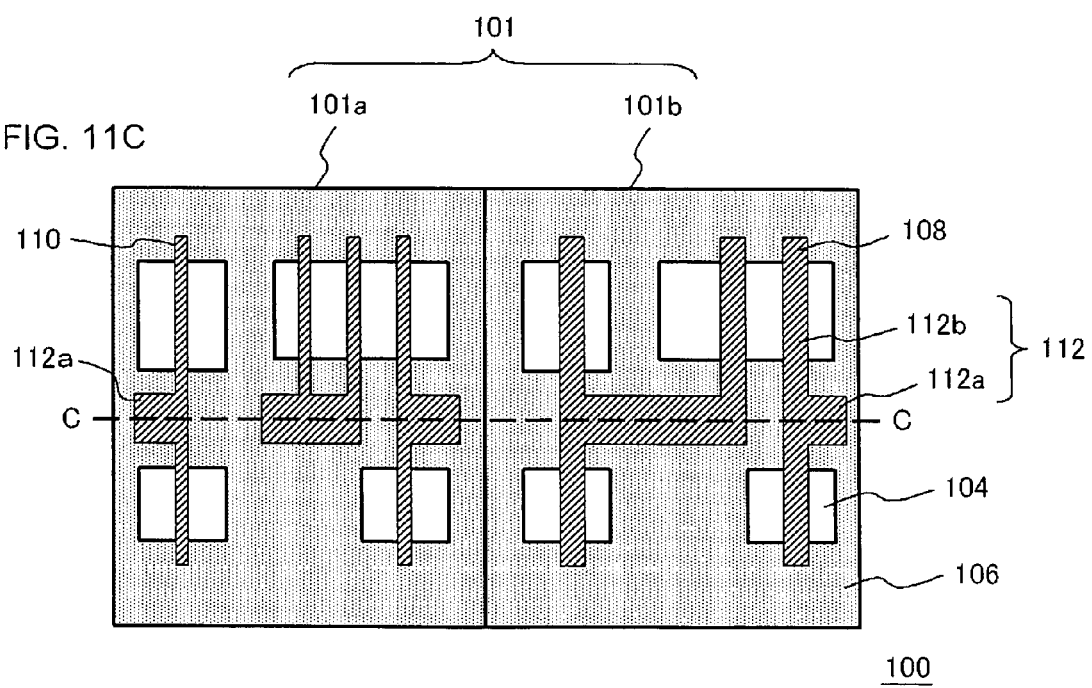

Thereafter, the polysilicon film 120 is selectively dry-etched through the wide-pattern-making resist film 130, the SiOC film 124 and the amorphous carbon film 122 (FIG. 11B, FIG. 11C). FIG. 11B is a sectional view taken along line C-C in FIG. 11C.

Thereafter, diffusion layers and so forth are formed by the general methods, to thereby manufacture the semiconductor device shown in FIG. 1.

The embodiment of the present invention having been described in the above referring to the attached drawings are merely examples of the present invention, allowing adoption of various configurations other than the above-described one.

The above-described embodiment showed an exemplary case where the Levenson-type PSM was used in the light exposure for forming the fine patterns, wherein the light exposure may also be light exposure based on modified illumination such as dipole, or may be light exposure using a half-tone mask under general illumination conditions. Also these cases are applicable similarly to as described in the above, except for the shifter arrangement.

The hard mask film may be configured as a single layer, or as a stacked structure having a larger number of layers.

Although not specifically illustrated, the resist film may be formed as being preceded by formation of an anti-reflection film thereunder.

It is apparent that the present invention is not limited to the above embodiment, and may be modified and changed without departing from the scope and spirit of the invention.

What is claimed is:

1. A method of manufacturing a semiconductor device comprising a step of forming a predetermined pattern containing a plurality of gate patterns, in a process target film formed on or over a semiconductor substrate, said step of forming said predetermined pattern including:
   a step of classifying said predetermined pattern into fine gate patterns and the other patterns;
   a step of forming a first resist film having a first pattern, by forming a hard mask film and a resist film in this order on said process target film, and by subjecting the resist film to light exposure through a first photomask having said first pattern for forming said fine gate patterns, followed by development;
   a step of forming said first pattern into said hard mask film, by selectively dry-etching said hard mask film through said first resist film used as a mask;
   a step of forming a second resist film having a second pattern, by forming a resist film on said process target film and said hard mask film, and by subjecting the resist film to light exposure through a second photomask having said second pattern for forming said other patterns, followed by development; and
   a step of selectively dry-etching said process target film through said second resist film and said hard mask film used as masks.

2. The method of manufacturing a semiconductor device as claimed in claim 1, wherein, in said step of classifying said predetermined pattern into the fine gate patterns and the other patterns, gate patterns having width narrower than a predetermined width are classified into said fine gate patterns, and gate patterns having width not narrower than said predetermined width are classified into said other patterns.

3. The method of manufacturing a semiconductor device as claimed in claim 1, further comprising, as being provided between said step of forming said first pattern in said hard mask film, and said step of forming said second resist film:
   a step of forming a third resist pattern having a third pattern, by forming a resist film on said hard mask film, and by subjecting said resist film to light exposure through a third photomask having said third pattern for removing a part of said first pattern formed in said hard mask film, followed by development; and
   a step of further selectively dry-etching said hard mask film through said third resist film used as a mask.

4. The method of manufacturing a semiconductor device as claimed in claim 3, wherein
   said first pattern is configured so that said fine gate patterns are extended in the longitudinal direction thereof to the end of a basic block region, and
   said third pattern is configured so as to remove the extended portions of said first pattern.

5. The method of fabricating a semiconductor device as claimed in claim 3, wherein
   said hard mask film is configured by a stacked film having a first hard mask film and a second hard mask film stacked therein in this order,
   said second hard mask film is processed into said first pattern, in said step of forming said first pattern in said hard mask, and
   said step of further selectively dry-etching said hard mask film through said third resist film used as a mask includes a step of forming a fourth pattern in said second mask, by selectively dry-etching said second hard mask film, using said third resist film as a mask, and using said first hard mask film as an etching stopper.

6. The method of manufacturing a semiconductor device as clamed in claim 5, wherein
   said step of further selectively dry-etching said hard mask film through said third resist film used as a mask further includes, after the step of forming said fourth pattern in said second hard mask film, a step of forming said fourth pattern in said first hard mask film by selectively dry-etching said first hard mask film through said second hard mask film used as a mask.

7. The method of manufacturing a semiconductor device as claimed in claim 1, wherein said first photomask is a Levenson-type PSM.

* * * * *